United States Patent
Gutta et al.

(10) Patent No.: US 9,455,731 B1
(45) Date of Patent: Sep. 27, 2016

(54) DIGITAL-TO-ANALOG CONVERTER WITH DIGITAL CHARGE SHARING COMPONENTS

(71) Applicant: ANALOG DEVICES GLOBAL, Hamilton (BM)

(72) Inventors: Avinash Gutta, Bangalore (IN); Michael Coln, Lexington, MA (US)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/819,321

(22) Filed: Aug. 5, 2015

(51) Int. Cl.
| H03M 1/66 | (2006.01) |
| H03M 1/00 | (2006.01) |
| H03M 1/74 | (2006.01) |
| H03M 1/36 | (2006.01) |
| G09G 3/36 | (2006.01) |

(52) U.S. Cl.
CPC ............. *H03M 1/002* (2013.01); *H03M 1/664* (2013.01); *G09G 3/3688* (2013.01); *H03M 1/00* (2013.01); *H03M 1/365* (2013.01); *H03M 1/747* (2013.01)

(58) Field of Classification Search
CPC ...... H03M 1/00; H03M 1/747; H03M 1/365; G09G 3/3688
USPC ......... 341/150, 144, 145, 136, 159; 345/100
See application file for complete search history.

(56) References Cited

U.S. PATENT DOCUMENTS

| 5,739,805 A * | 4/1998 | Dingwall ............. G09G 3/2011 345/100 |
| 8,456,342 B2 | 6/2013 | Wu et al. |
| 8,970,639 B2 | 3/2015 | Tu |

FOREIGN PATENT DOCUMENTS

| KR | 19970031321 A | 6/1997 |
| TW | 518832 B | 1/2003 |

OTHER PUBLICATIONS

Ginsburg et al., "An Energy-Efficient Charge Recycling Approach for a SAR Converter with Capacitive DAC," IEEE International Symposium on Circuits and Systems (ISCAS 2005), May 2005, pp. 184-187.

Moon et al., "A Switched-Capacitor DAC with Analog Mismatch Correction," IEEE International Symposium on Circuits and Systems (ISCAS 2000), May 2000, pp. 421-424.

* cited by examiner

*Primary Examiner* — Joseph Lauture
(74) *Attorney, Agent, or Firm* — Schwegman Lundberg & Woessner, P.A.

(57) ABSTRACT

A method and a digital-to-analog converter (DAC) circuit involve forming an analog signal using charge sharing operations. The DAC circuit includes a plurality of digital components with associated parasitic capacitances. The digital components are activated based on a digital input code, such that charge is shared among the parasitic capacitances to form a first analog signal proportional to the digital input code. The digital components can also be activated based on a complementary code to form a second analog signal. The first analog signal and the second analog signal can be used to form, as a final output of the DAC circuit, an analog signal that is linearly proportional to the digital input code.

18 Claims, 10 Drawing Sheets

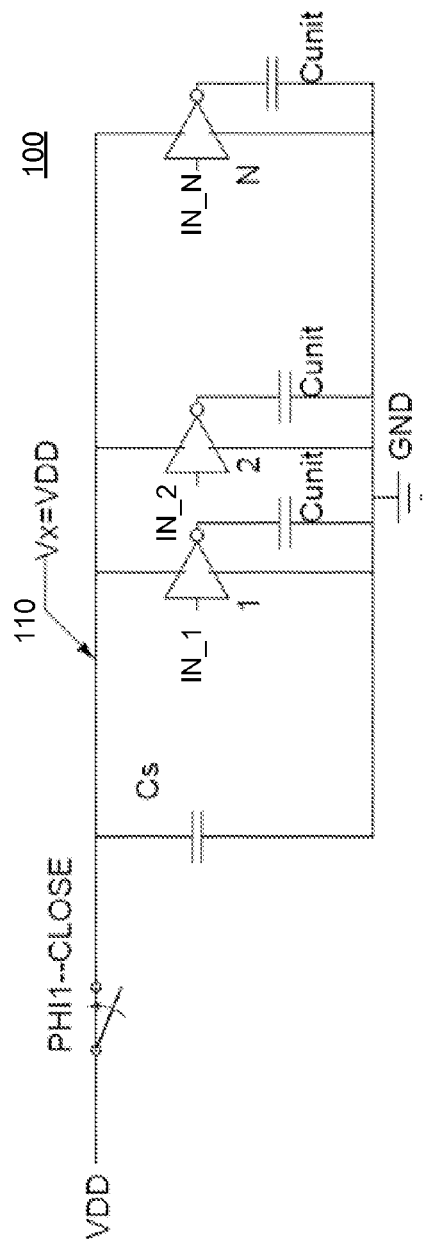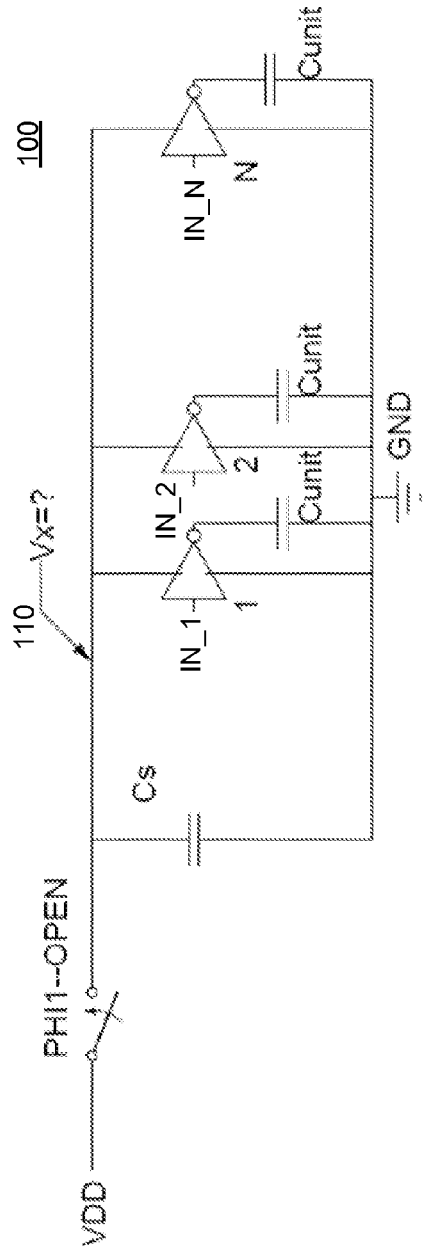
Fig. 1A
Fig. 1B

DIGITAL-TO-ANALOG CONVERTER WITH DIGITAL CHARGE SHARING COMPONENTS

BACKGROUND

Digital-to-analog converters (DACs) use analog components, such as resistors and capacitors, to generate an analog signal corresponding to a digital input. Compared to digital components, analog components consume more power and are physically larger. More components will be required as DACs continue to improve in terms of processing speed and accuracy. The scalability of DAC designs will therefore depend on maximizing layout efficiency, minimizing overall geometry, and minimizing power consumption.

BRIEF DESCRIPTION OF THE DRAWINGS

FIG. 1A shows a first configuration of a DAC circuit according to an embodiment of the present invention.

FIG. 1B shows a second configuration of the DAC circuit of FIG. 1A.

DETAILED DESCRIPTION

Figure 2:
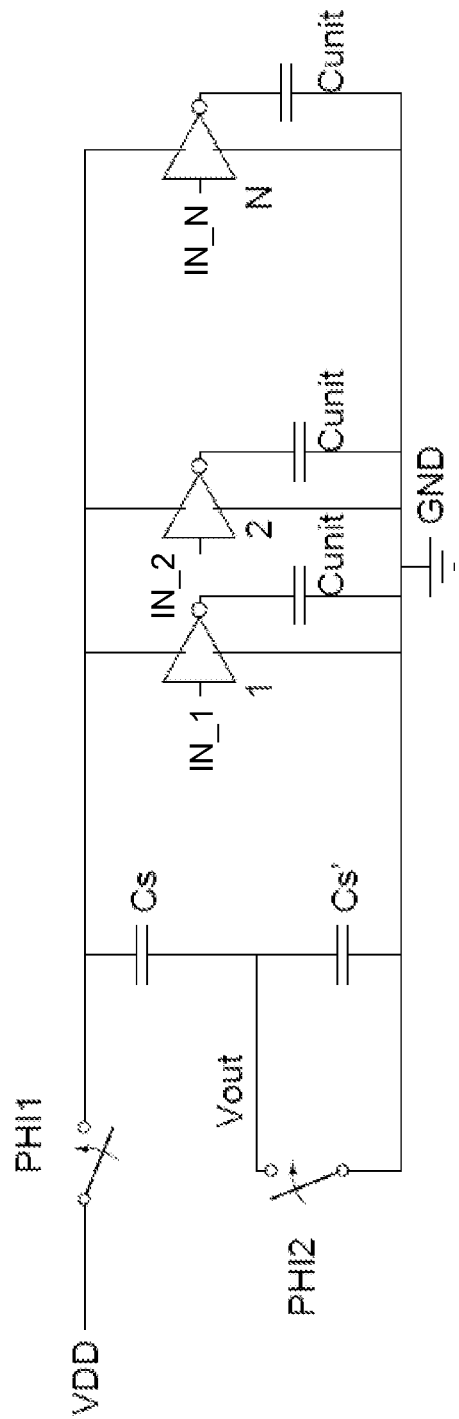
FIG. 2 shows a first configuration of a DAC circuit according to a further embodiment of the present invention.

Embodiments of the present invention are directed to the use of digital components to store and move charge in connection with digital-to-analog conversion. Digital components offer several important advantages over analog components. They are less expensive to produce, smaller in size, faster, and consume less power than comparable analog components. Therefore, it is an object of the present invention to construct a DAC from digital components, and to thereby reduce or eliminate the use of analog components in connection with conversion.

Examples are described in which the digital components are unit inverters, e.g., a complementary metal-oxide semiconductor (CMOS) inverter formed by a PMOS transistor connected to an NMOS transistor, with a shared gate input and a shared drain output. However, the digital components are not limited to inverters and may encompass other digital circuit elements that are capable of storing and moving charge.

FIG. 1A shows a first configuration of a DAC circuit 100 according to an embodiment of the present invention. The circuit 100 includes a switch PHI1, which in FIG. 1A is closed to connect a reference voltage, e.g., a positive supply voltage VDD, to a plurality of digital inverters 1 to N. As an alternative to VDD, other reference voltages, including negative voltages, may be used depending on a desired output range and subject to performance considerations such as whether the selected reference voltage would result in excessive noise or other artifacts that would degrade the quality of the DAC output. Each of the inverters 1 to N includes a parasitic capacitance Cunit, which may correspond to an intrinsic capacitance (generated in the intrinsic region between the source and drain) of the MOSFET devices forming the inverter, plus any extrinsic capacitance generated outside the intrinsic region. Each inverter is connected between VDD and a second reference voltage, e.g., a ground voltage GND. In a CMOS inverter, the source terminal of the PMOS transistor would be connected to VDD, and the source terminal of the NMOS transistor would be connected to GND.

Each inverter may include a respective gate input signal IN_1 to IN_N. As will be explained, the gate inputs and the switch inputs can be controlled in various ways to produce an analog signal that is proportional to a digital input code, which will be referred to herein by its decimal (non-binary) value "n", where n is less than or equal to a full scale value "N". The gate inputs, as well as the inputs to switches such as PHI1, may be supplied by a hardware and/or software controller (not shown). In FIG. 1, if the inputs IN_1 to IN_N are held at logic level HIGH, then the output of the inverters is logic level LOW, so that the charge on each of the Cunit capacitors is zero.

The circuit 100 includes a main capacitor CS, which may be an explicit, physical capacitor, i.e., an analog component. Alternatively, CS may be a digital component. For example, CS may include an inverter or a set of connected inverters, whose inputs are tied to logic level LOW to produce CS as a parasitic capacitance, similar to the Cunit parasitic capacitances. In this manner, a DAC circuit according to the present invention may be implemented entirely using digital components. As will be explained, the capacitance CS assists in developing and moving charge in the circuit 100. In this role, the capacitance value of CS is preferably large in comparison to the Cunit capacitance of the individual inverters, so that the charge developed at CS can later be distributed among multiple Cunit capacitances. CS is connected between VDD and GND, in parallel with each of the inverters.

FIG. 1B shows a second configuration of the DAC circuit 100, in which the switch PHI1 is open so that the node 110 previously connecting the inverters to VDD is no longer at a voltage of VDD, but is instead at some unknown voltage Vx. Additionally, n number of the gate inputs IN_1 to IN_N are pulsed LOW so that n corresponding inverters each draw a charge of Cunit*VDD. This charge is drawn from the charge previously stored in CS, so there is charge sharing between CS and the n inverters. The total charge drawn by this charge sharing operation is n*Cunit*VDD. The following set of formulas illustrate how to solve for Vx:

$$Q(CS) = CS * VDD \tag{1}$$

$$Q(CS + n*\text{Cunit}) = Vx(CS + n*\text{Cunit}) \tag{2}$$

$$Q(CS) = Q(CS + n*\text{Cunit}) \tag{3}$$

$$VX = \frac{CS}{CS + n*\text{Cunit}} * VDD \tag{4}$$

where Q(CS) is the charge stored in CS and Q(CS+n*Cunit) is the total charge stored in CS and the n inverters. Equation (3) is based on the principle of charge conservation, which states that charge can neither be created nor destroyed. Applied to the circuit 100, it means that the total charge stored in the first configuration, Q(CS) is equal to the total charge stored in the second configuration, Q(CS+n*Cunit).

As evident from equation (4), Vx is a non-linear function of the input code n. Therefore, Vx is roughly proportional to the input code n. Examples will now be described in which various techniques are applied to derive an analog output that is linearly proportional to the input code n. Linearity is desirable because it represents an improvement in the accuracy of the conversion, in that the analog output is better able to closely track changes in the digital input.

FIG. 2 shows a first configuration of a DAC circuit 200 according to an embodiment of the present invention. The DAC circuit 200 includes the inverters 1 to N, the switch PHI1, and capacitor CS. Additionally, the circuit 200 includes a complementary capacitor CS' in series with capacitor CS and a switch configured to connect the bottom plate of capacitor CS to GND. In the first configuration, PHI1 and PHI2 are both closed and the gate inputs of all N inverters are pulsed HIGH. The first configuration of circuit 200 operates to refresh the circuit by developing a charge on CS using VDD, similar to the first configuration of circuit 100 discussed earlier.

Figure 3:
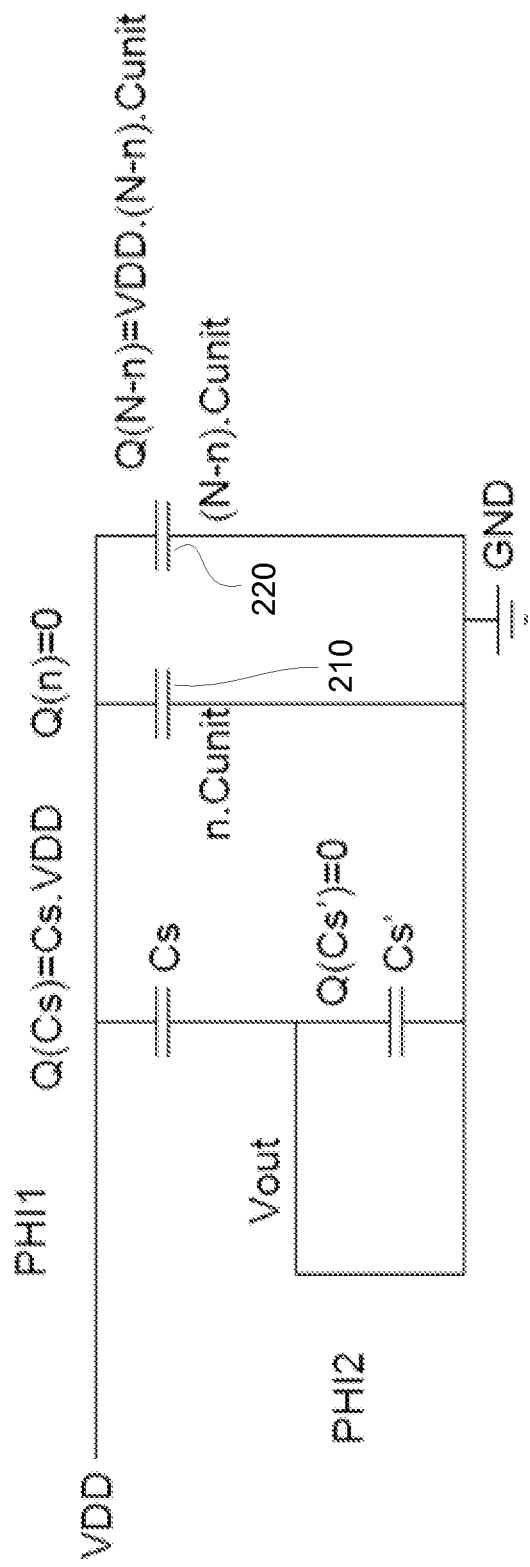
FIG. 3 shows a simplified representation of the circuit of FIG. 2 after applying a complementary code.

After refreshing the circuit 200, charge may be stored based on the digital input. However, unlike the circuit 100, the gate inputs are controlled based on a complementary code (N−n), i.e., the full scale code N minus the input code n. Further, PHI1 and PHI2 remain closed. FIG. 3 shows a simplified representation of the circuit 200 after applying the complementary code in the first configuration. The closing of PHI1 sets the charge on CS to Cs*VDD. The closing of PHI2 sets the charge on CS' to zero. The n inverters whose inputs are held high are represented as a single capacitor 210. The N−n inverters whose inputs are pulsed low are represented by another capacitor 220. The charge Q(n) stored in the capacitor 210 is equal to zero. The charge Q(N−n) stored in the capacitor 220 is equal to VDD*(N−n)*Cunit. Thus, the total charge in the circuit is given by:

$$Qtot=Cs*VDD+(N-n)*Cunit*VDD \quad (5)$$

Figure 4:
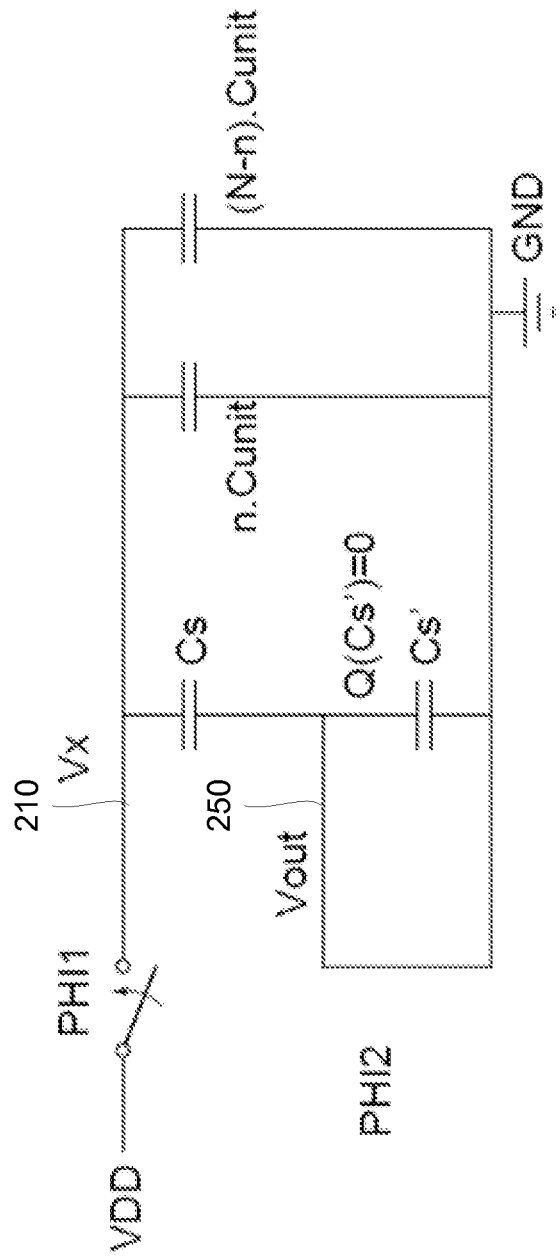
FIG. 4 shows a simplified representation of a second configuration of the circuit of FIG. 2.

FIG. 4 shows a simplified representation of a second configuration of the circuit 200 according to an embodiment of the present invention. The second configuration may be entered after applying the complementary code N−n as explained above. In the second configuration, PHI1 is opened and PHI2 remains closed, while gate inputs of the remaining n inverters, to which the complementary code was not applied in the previous step, are pulsed low. As noted earlier with respect to the circuit 100, opening PHI1 causes the node corresponding to Vx (reference numeral 210 in FIG. 4) to be at an unknown voltage. Opening PHI1 in conjunction with pulsing the inputs of the n inverters low thus results in the following expression for the total charge in the circuit:

$$Qtot'=Vx(CS+(N-n)*Cunit+n*Cunit) \quad (6)$$

From the principle of charge conservation, Qtot'=Qtot so that:

$$Vx = \frac{CS + (N-n)*Cunit}{CS + N*Cunit} *VDD \quad (7)$$

Figure 5:
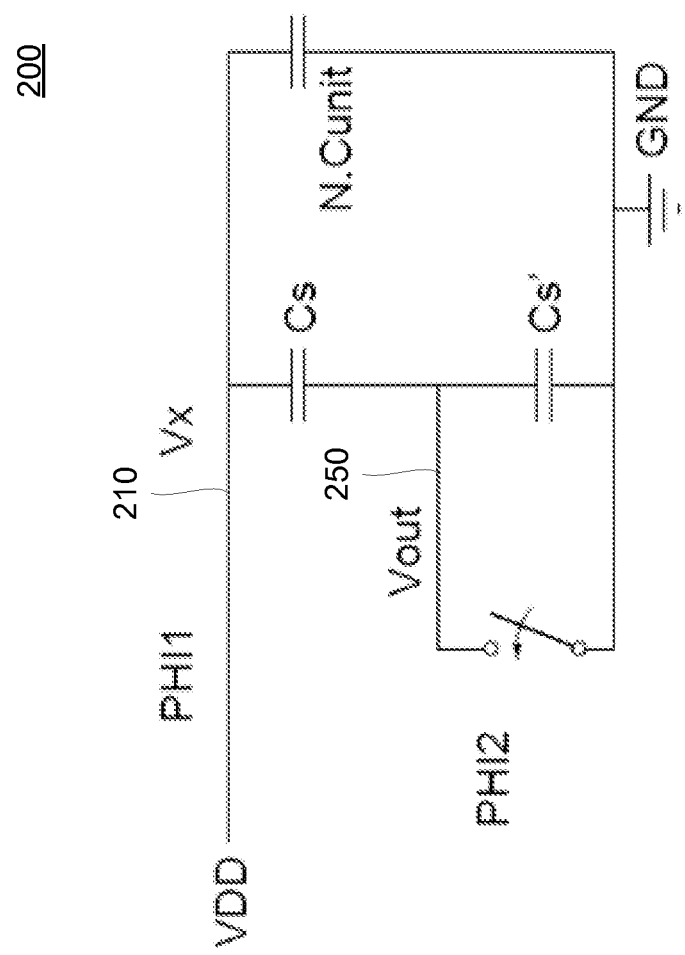
FIG. 5 shows a simplified representation of a third configuration of the circuit of FIG. 2.

FIG. 5 shows a simplified representation of a third configuration of the circuit 200 according to an embodiment of the present invention. The third configuration may be entered after pulsing the inputs of the n inverters low, i.e., after applying both the complementary code N−n and the input code n, as explained above in connection with FIGS. 3 and 4. The third configuration may be used to initiate a final charge transfer operation that produces an output signal Vout at a node 250 by first opening PHI2, then closing PHI1, all while holding the existing state of the inverters, i.e., keeping the gate inputs of all N inverters low. Vout is produced by charge sharing between CS and CS'. Applying charge conservation yields:

$$CS*(-Vx)=CS(-VDD+Vout)+CS'(Vout) \quad (8)$$

$$Vout = \frac{CS(VDD - Vx)}{CS + CS'} \quad (9)$$

In equation (8), the negative signs are a consequence of charge conservation between the bottom plate of CS (which has negative charge) and the top plate of CS' (which has positive charge). A final expression for Vout is derived by substituting for Vx using equation (7):

$$Vout = \frac{CS}{CS + CS'} *VDD* \frac{Cunit}{CS + (N*Cunit)} *n \quad (10)$$

As evident from equation (10), Vout is a linear function of the input code n. In particular, Vout can be expressed as a function of three coefficient terms by which the input code n is multiplied. Thus, an analog signal having a desired magnitude in relation to a given digital input code n, and which linearly scales in proportion to the input code n, can be produced by choosing appropriate values for the variables in these coefficients (e.g., CS, CS' and Cunit).

It should be noted that the use of CS', and therefore the charge sharing step between CS and CS', is entirely optional. The above discussion is intended as an illustration of how a linearly proportional transfer function can be derived using charge sharing, in particular using the complementary input code N−n. The complementary input code N−n can be applied even where CS' and PHI2 are omitted, as in the circuit 100. An alternative linear transfer function can then be derived by taking advantage of an observation, based on equation (7), that Vx is linearly proportional to the complementary code N−n instead of the input code n. If a code of N−n is applied as a substitute for the input code n in the steps explained above in connection with FIGS. 2 to 5, Vx will be linearly proportional to N−(N−n), i.e., the input code n, and can be used as the analog output instead of Vout. The controller may therefore be configured, e.g., hardwired or programmed, to supply N−n as the input code and n as the complementary code, in response to an actual input code of n.

Figure 6:
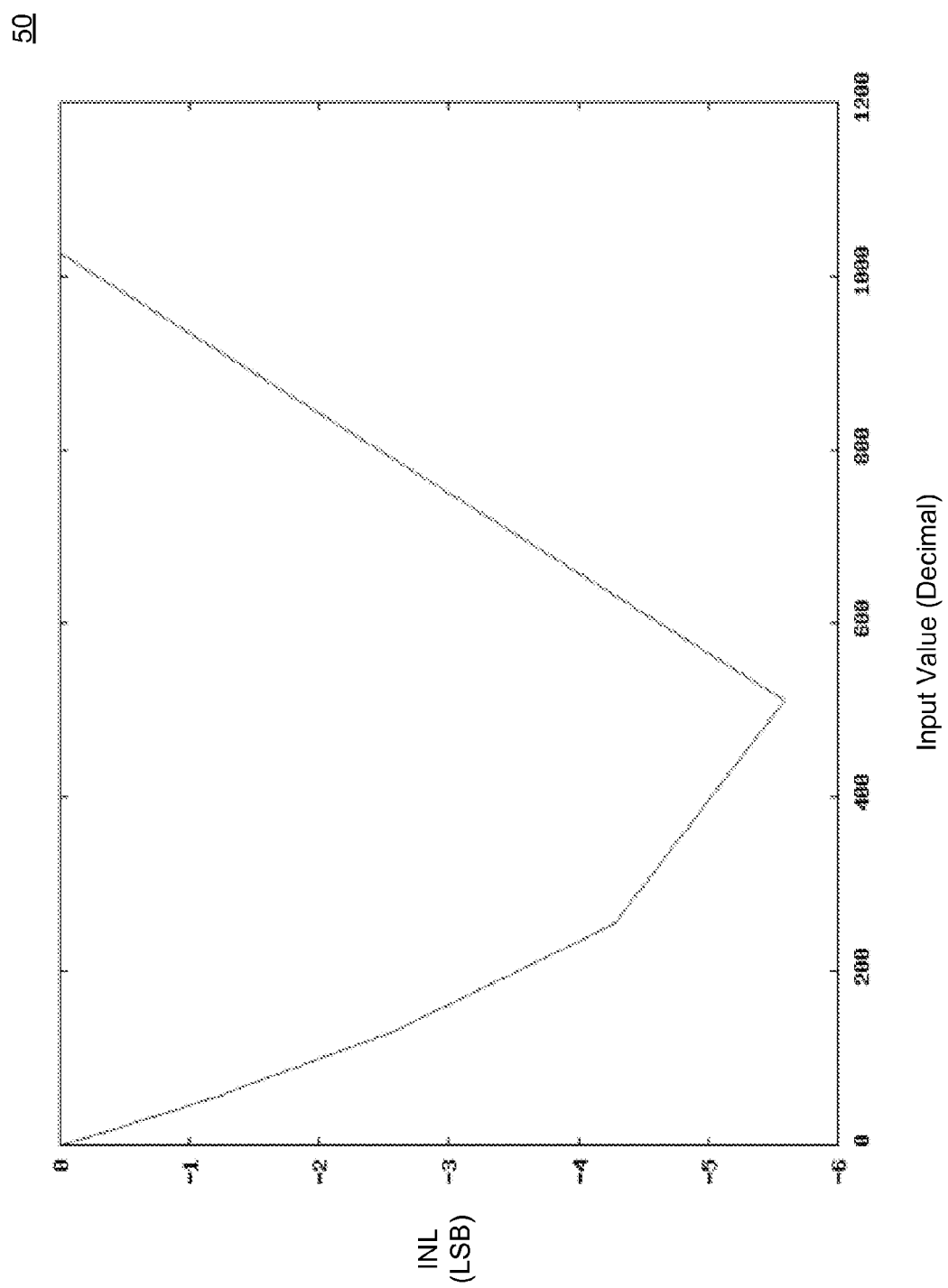
FIG. 6 is a simulated graph of integral nonlinearity for a circuit according to an embodiment of the present invention.

FIG. 6 is a simulated graph 50 of integral non-linearity (INL) for a 10-bit DAC circuit constructed according to the embodiment shown in FIG. 2. INL is a measure of the deviation between an ideal analog output and the actual analog output, for a given digital input. The vertical axis represents the INL in units of least significant bit (LSB), where 1 LSB is a change in output corresponding to a change in digital input code of 1. The horizontal axis represents the digital input value in decimal form. The maximum INL in graph 50 is −6 LSBs. A desirable INL would be in the range of approximately −1 to +1 LSBs. Graph 50 also shows that the INL varies with input value, in this case nearly quadratically. Thus, the linearity of the DAC may vary even when the output is theoretically linear, as indicated in equation (10). One reason is because the Cunit capacitances are junction capacitances influenced by VDD. More specifically, Cunit varies depending on the drain voltages of the inverters. Since the inverter supply is not fixed (the supply is connected to VDD depending on the input code n), the drain voltages and therefore Cunit will vary depending on the input code. Thus, the analog output may exhibit non-linear behavior for certain codes.

Figure 7:
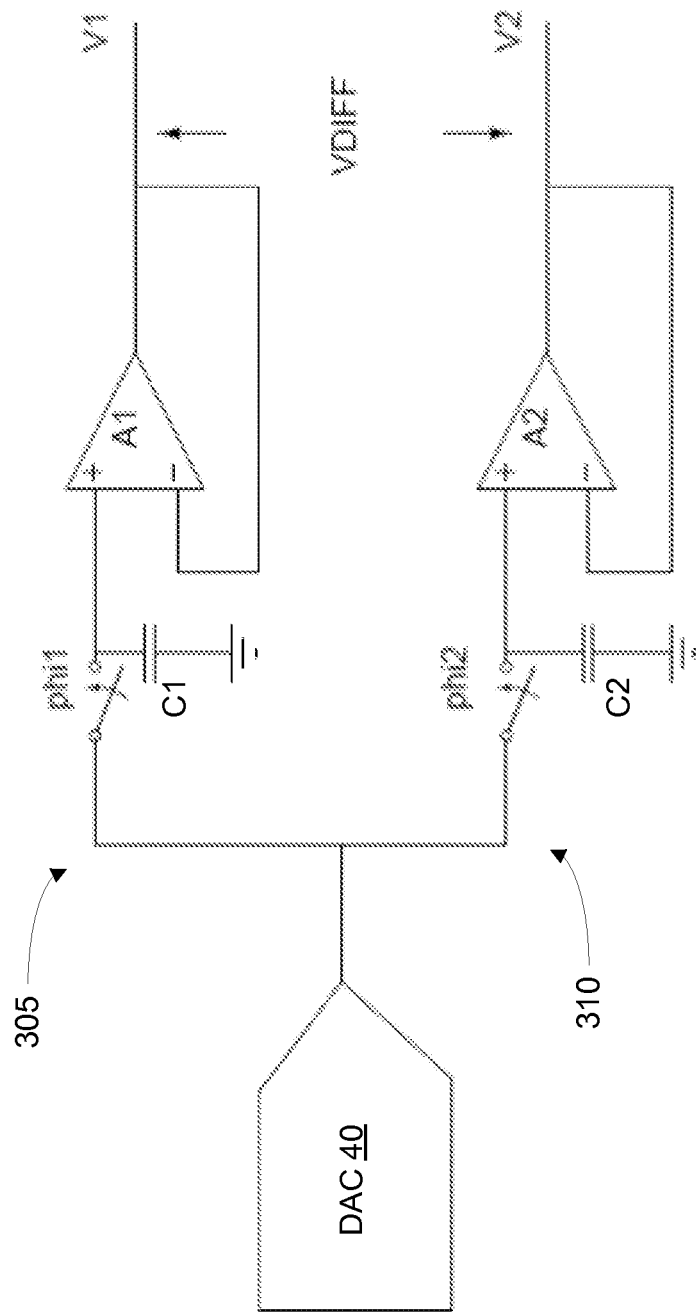
FIG. 7 shows a DAC circuit according to a further embodiment of the present invention.

FIG. 7 shows a DAC circuit 300 according to an embodiment of the present invention. The circuit 300 includes a DAC 40, switches phi1 and phi2, and amplifiers A1 and A2. The DAC 40 can be implemented using the DAC circuit 200 or a DAC circuit according to another of the earlier described embodiments. The circuit 300 includes two paths 305 and 310, which respectively produce output voltages V1 and V2 that are amplified versions of a nominally linear DAC output, e.g., Vx or Vout produced by the circuit 200. The difference VDIFF between V1 and V2 may be used as a final analog output. The formation of VDIFF is a pseudo-differential operation because V1 and V2 are not produced using differential input signals. Instead, V1 and V2 are produced by applying the input code n and the complementary code N−n to the DAC 40 separately, in different conversion cycles. For example, a first analog output may be produced using n as the input code to the DAC 40 in a first conversion cycle, then transferred to a capacitor C1 that holds the analog output for input to the amplifier A1. Similarly, a second analog output may be produced using N−n as the input code to the DAC 40 in a second conversion cycle, then transferred to a capacitor C2 that holds the second analog output for input to the amplifier A2. As with the capacitor CS in FIG. 1, the capacitors C1 and C2 may be explicit capacitors or parasitic capacitors.

As an alternative to using the single DAC 40 to sequentially process the input code n and the complementary code N−n, a DAC circuit according to another embodiment of the present invention may include at least two DACs, each with their own set of digital components. The codes n and N−n can be processed in parallel at respective ones of the DACs so that the first analog output and the second analog output are formed substantially simultaneously. For example, one DAC could be dedicated to processing the input code n, while another DAC is dedicated to processing the complementary code N−n. Alternatively, the DACs may alternate between processing the input code and the complementary code, switching roles with each other in consecutive conversion cycles. The first analog output and the second analog output would then be processed in the manner explained above to form the difference VDIFF. This would provide a throughput double that of the circuit 300, but at a cost of doubling the circuit area.

The amplifiers A1, A2 may be operational amplifiers arranged in a negative feedback configuration in which the respective output V1, V2 is connected to an inverting input of the same amplifier. C1 and C2 are connected to the non-inverting input of their respective amplifiers A1, A2, and are charged by connecting the output of the DAC 40 using the switches phi1 and phi2. It should be noted that phi1 and phi2 are not necessarily controlled with the same timing as the switches PHI1 and PHI2 discussed earlier. PHI1/PHI2 relate to the internal conversion operations within the DAC, whereas phi1/phi2 are used to transfer the conversion results at different times to their respective capacitors C1/C2. Thus, phi1 and phi2 can be closed at non-overlapping times, after the respective conversion operation is complete and before the next conversion cycle.

The circuit 300 operates as follows. The graph 50 in FIG. 6 indicates that, in some instances, the DAC transfer function may exhibit a quadratic behavior. Therefore, assuming that the non-linear behavior is limited to second order effects, the transfer function of the DAC 40 can be expressed as:

$$y = a*(\text{input code}) + b*(\text{input code}) \tag{11}$$

where a and b are constants respectively associated with the linear and nonlinear components. Thus, the transfer functions when the input codes are n and N−n are:

$$y_n = a*(n) + b(n)^2 \tag{12}$$

$$y_{N-n} = a*(N-n) + b(N-n)^2 \tag{13}$$

Subtracting equation (13) from (12) yields:

$$y_n - y_{N-n} = y'_n = n*(2a + 2bN) - aN - bN^2 \tag{14}$$

It is apparent from equation (14) that the modified transfer function, corresponding to the difference between V1 and V2, is linear with respect to the input code n. Specifically, the linear component is formed by the product of the input code n and a coefficient (2a+2 bN). The two remaining terms are functions of the full scale code N, a fixed value.

From the examples described so far, it has been shown that an analog signal that is linearly proportional to a digital input code can be generated through charge storage and charge sharing, using parasitic capacitances of digital components. The digital components were described as inverters. However, other types of digital components would also be suitable and include, for example, other digital logic gates such as NAND, NOR, or a non-inverting gate (i.e., a buffer). In an embodiment using non-inverting components, the activation of the components may be performed in a manner complementary to that described herein with respect to inverting components, for example, pulsing a non-inverting component HIGH where an inverting component would be pulsed LOW.

Figure 9:
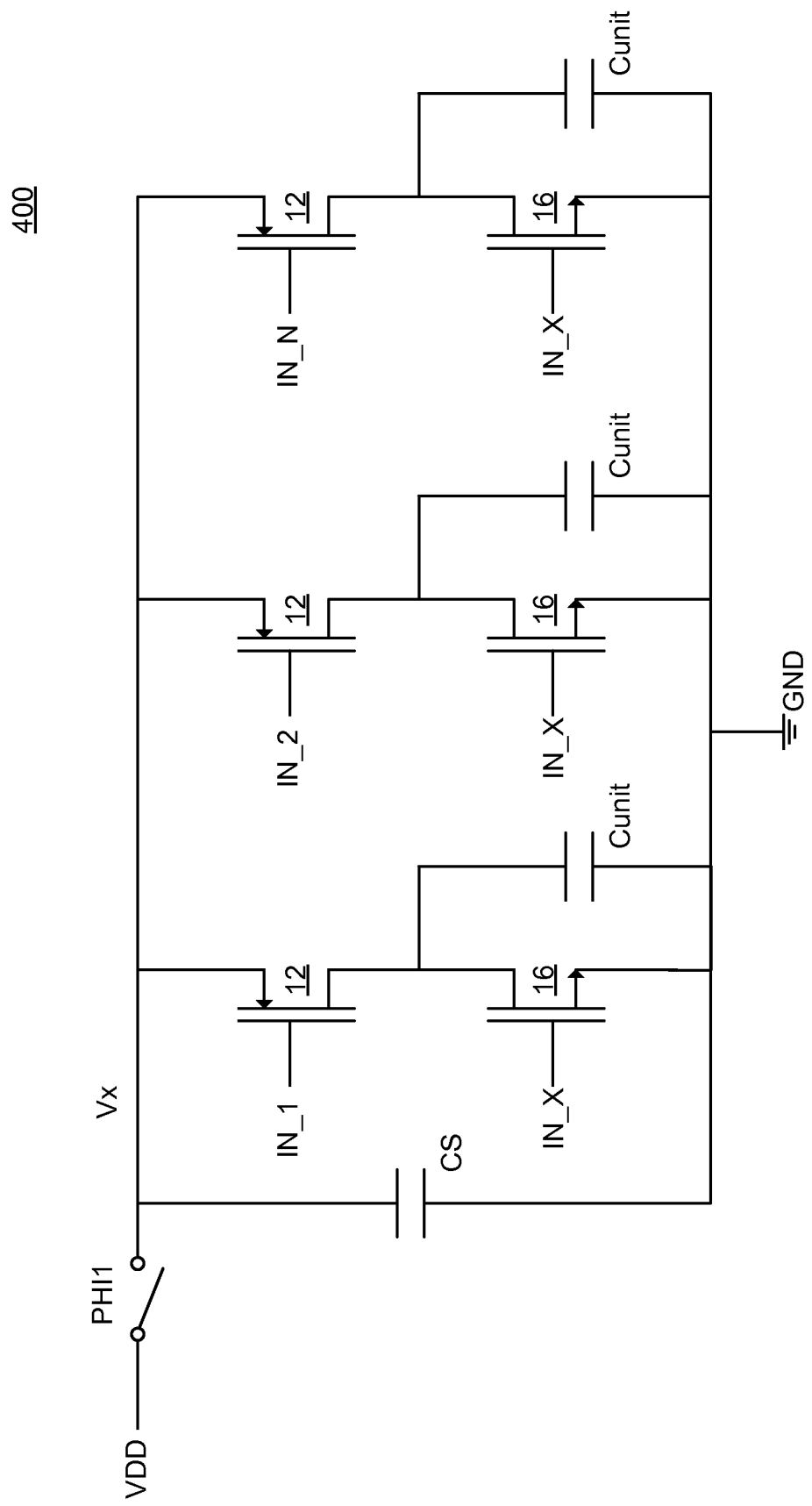
FIG. 9 shows a DAC circuit according to a further embodiment of the present invention.

FIG. 9 shows a DAC circuit 400 according to an embodiment of the present invention. The circuit 400 includes digital components which are arranged similar to a conventional CMOS inverter (PMOS transistors 12 in series with NMOS transistors 16). However, the transistors 12 and 16 are separately controlled, rather than controlled using the same gate input. Specifically, the PMOS transistors 12 may be controlled using IN_1 to IN_N, while the NMOS transistors 16 are controlled with a shared input IN_X. The circuit 400 may be operated using charging steps analogous to those described in connection with circuit 200. CS' and PHI2 are omitted in this example. Therefore, as explained earlier, N−n may be used in place of n as the input code to generate a linear output.

PHI1 may be opened and closed in the same manner described earlier with respect to circuit 200. First, PHI1 is closed to charge capacitor CS to VDD, while controlling the transistors 12/16 to prevent VDD from charging the parasitic capacitances Cunit. This prepares the circuit 200 for the next conversion cycle. To achieve a similar effect to pulsing the gate inputs of all the inverters high, the NMOS transistors 16 may be activated by pulsing IN_X to logic level HIGH, while simultaneously setting IN_1 to IN_N to HIGH, so that the charge on each Cunit is zero.

Next, PHI1 remains closed while n of the PMOS transistors 12 are activated by pulsing their gate inputs LOW, and while all of the NMOS transistors 16 are deactivated by pulsing IN_X LOW. This transfers some of the charge on CS to the n Cunit capacitors.

Afterwards, PHI1 is opened to disconnect VDD before pulsing the gate inputs of the remaining N−n PMOS transistors LOW. This enables charge sharing between CS, the N−n PMOS transistors, and the n PMOS transistors. The voltage Vx may then be used as the analog output, e.g., directly used or subjected to further processing such as amplification in connection with the psueudo-differential operation of FIG. 7.

Figure 8:
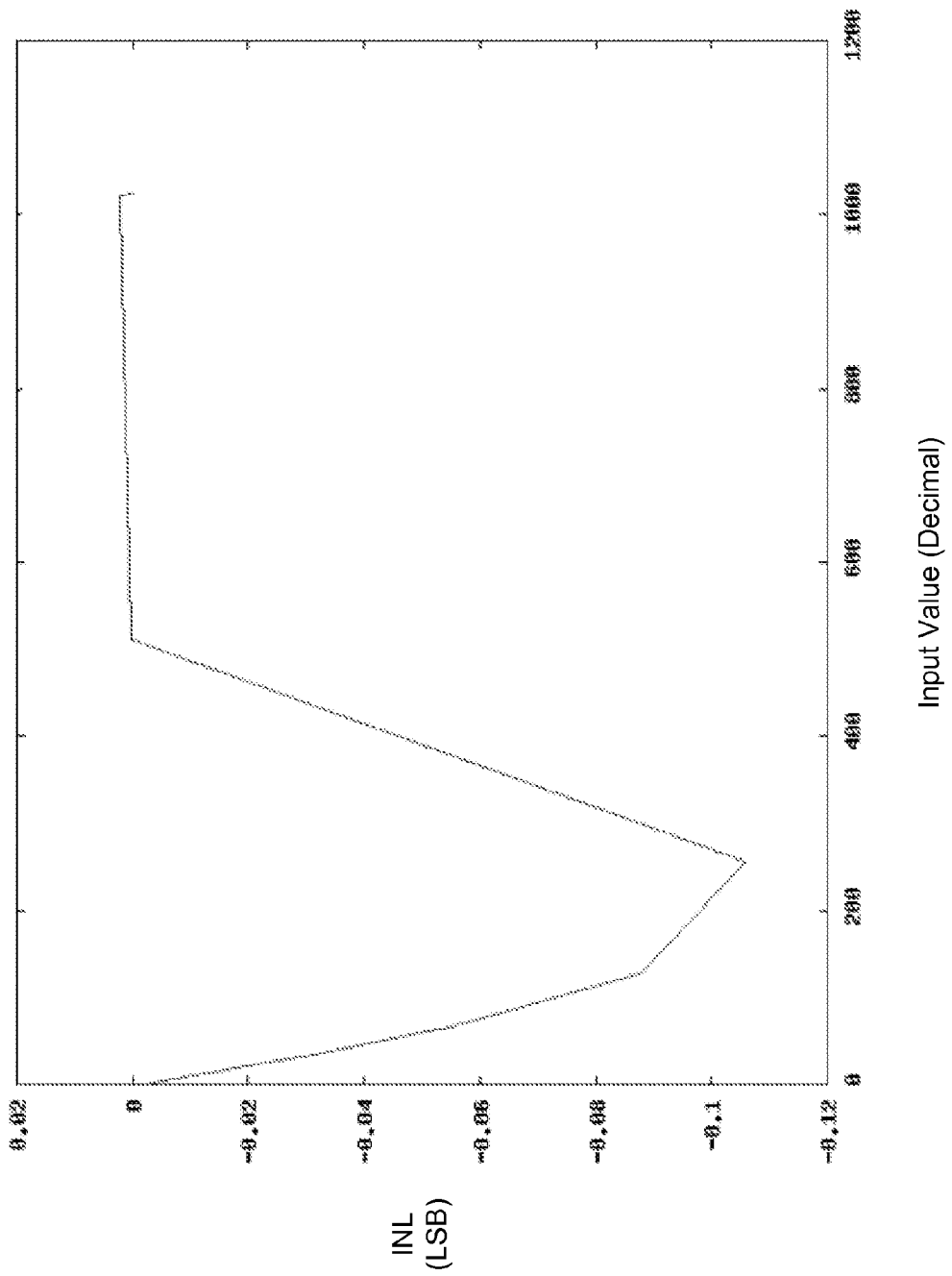
FIG. 8 is a simulated graph showing integral nonlinearity for a circuit according to a further embodiment of the present invention.

For comparison with the INL graph 50 in FIG. 6, the graph 50' in FIG. 8 illustrates the effects of applying the psueudo-differential technique in FIG. 7 to the same 10-bit DAC circuit used for generating FIG. 6. The INL is significantly improved.

The circuit 400 is useful for situations where the phenomenon known as "shoot-through" is prone to occur. Shoot-through occurs when a pull-up device such as a PMOS transistor is controlled using the same input as a pull-down device such as an NMOS transistor. Although the pull-up device and pull-down device are theoretically never supposed to be activated simultaneously, there is a potential risk that this could occur in practice depending on how the devices are manufactured. When both devices are activated, a path is formed from the positive supply to the negative supply, drawing a large amount of current that could damage the devices. Thus, in some instances, it may be preferable to control the devices separately. In fact, a DAC circuit could be designed to be switchable between shared control and separate control. As shown in FIG. 9, the control inputs are essentially the same as in the circuit 200, but with the addition of IN_X. Therefore, the cost of providing an option for shared control is minimal.

Figure 10:
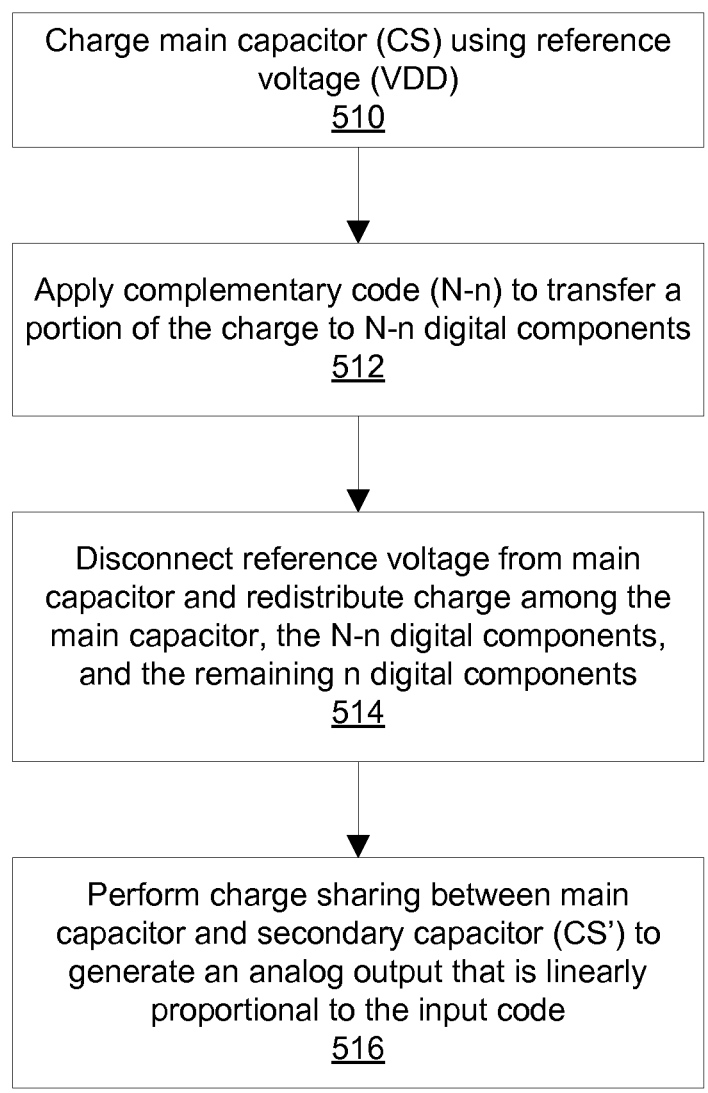
FIG. 10 illustrates an exemplary method for performing digital-to-analog conversion according to an embodiment of the present invention.

FIG. 10 is a flowchart of a method 500 for performing digital-to-analog conversion according to an embodiment of the present invention. The method 500 may be performed using any of the example DAC circuits described earlier. Steps illustrated in the flowchart may be omitted and/or certain step sequences may be altered, and, in certain instances multiple illustrated steps may be simultaneously performed.

At step 510, a main capacitor (e.g., CS) is charged using a reference voltage (e.g., VDD). This step acts as a refresh operation that prepares the DAC circuit for converting the next input code. While the main capacitor is being charged, the charge stored on all of the digital components is set to zero, e.g., by pulsing the gate inputs of inverters HIGH.

At step 512, a complementary code (e.g., "N−n") is applied to transfer a portion of the charge on the main capacitor to a first subset of digital components (e.g., N−n inverters). This may be done, as explained earlier, by pulsing the gate inputs of N−n inverters LOW while maintaining a connection from the reference voltage to CS and the entire set of (all N) inverters.

At step 514, a second charge sharing operation is performed to redistribute charge among the main capacitor, the first subset of digital components, and a second subset of digital components selected based on an input code (e.g., "n"). The second charge sharing operation may be performed, as explained earlier, by disconnecting the reference voltage from the main capacitor and each of the inverters, then pulsing LOW the gate inputs of those inverters that were not pulsed in step 512 (e.g., n inverters).

At step 516, an optional charge sharing step may be performed when the DAC circuit includes a secondary capacitor (e.g., CS' in circuit 200), to produce a final output signal (e.g., Vout). Step 516 may be performed by forming a path from the reference voltage to a second reference voltage (e.g., GND) through the main and secondary capacitors, while simultaneously holding an existing state of the digital components. For example, in circuit 200, the path is formed by opening switch PHI2 (which is normally closed to short the bottom terminal of CS to GND) before reconnecting VDD to CS and each of the inverters, all while keeping the gate inputs of the N inverters LOW.

The example embodiments provide a scalability advantage over conventional DAC circuits. In particular, the example embodiments are suitable for the geometries involved in deep sub-micron technology, which may be used to scale down the geometries of the digital components, and thus the overall DAC circuit, especially in terms of device area.

Additionally, the example embodiments provide inherently monotonic output. The same is not true of most DAC circuits implemented with analog components. Monotonicity requires that increases in the input code should never result in decreases in the output signal. Similarly, decreases in the input code should never result in increases in the output signal. The example discussed in connection with the circuit 200 provides output which is linear, and therefore monotonic. However, the output would be monotonic even if it were nonlinear, as with the circuit 100 initially described in connection with FIGS. 1A and 1B. This is because the architecture of the example DAC circuits activate additional unit elements as the input code increases, so that the output then increases, and therefore the transfer function is monotonic. Monotonicity may be viewed in terms of differential non-linearity (DNL), which is a measure of the deviation between the actual output difference between adjacent codes from some ideal difference. The ideal difference is typically defined as 1 LSB, so that the DNL would need to be more positive than −1 LSB in order for the output to qualify as monotonic. Under this definition of the ideal difference, the output of the example DAC circuits would qualify as monotonic irrespective of the input code format, although using a code with a large number of bits may potentially reduce the DNL to a positive value less than 1 LSB, but still above −1 LSB.

Additional embodiments of the DAC circuits 100, 200, 300 and 400 are possible. The digital components need not be CMOS inverters or even inverters. Instead, the digital components may encompass other digital circuit elements that are capable of storing and moving charge. For example, other digital logic gates such as NAND, NOR, or a non-inverting gate (i.e., a buffer) may be used.

Examples were described in which there was a 1:1 correspondence between the decimal values of the input code and the number of digital components selected (e.g., n inverters pulsed in response to an input code "n"). Another way of selecting the digital components is based on the binary value of the input code. For example, a binary scheme may involve the use of digital components whose dimensions are scaled such that their associated parasitic capacitances vary in size according to a binary distribution. That is, instead of a constant Cunit, the parasitic capacitances may differ such that their relative sizes are 1, 2, 4, 8, etc. In such a scheme, a transition from an input value of 7 to 8 may involve switching out three digital components (those representing 1, 2 and 4) and switching in one digital component (representing 8). Although this does not involve continuously increasing the number of activated digital components in response to increases in input code, monotonicity may still be achieved if the capacitances are sized properly. Other mappings between the input code and the digital components are possible.

Examples were described in which the main capacitor (CS) was charged by a positive supply voltage (VDD). However, the underlying functionality of the example circuit topologies is not affected by the sign of the supply voltage, nor by the choice of which supply is "ground." Thus, in an alternative embodiment, the main capacitor and the Cunit capacitors might be referenced to GND (e.g., by switchably connecting CS to GND instead of VDD) or the polarities of VDD and GND might be reversed so that VDD is a negative supply.

Examples were described in which the Cunit capacitors were parasitic capacitances. However, as with the capacitor CS, it may be possible to include explicit capacitors in place of, or in combination with, the Cunit capacitors, thereby forming a mixed digital-analog circuit. Alternatively, an all-digital circuit may be implemented by factoring interconnect capacitances into the design of Cunit. Interconnect capacitances are parasitic capacitances formed by the wiring or other elements that connect the transistors (e.g., a wire connecting the gates of an NMOS-PMOS transistor pair of an individual inverter). The geometry of the wires or other interconnect elements, for example their cross-sectional area and length, may be designed so as to contribute at least a substantial portion of Cunit.

The shoot-through problem discussed in connection with the circuit 400 may be minimized in other ways besides using separate control signals for the transistors. Another way to minimize shoot-through is to keep the shared gate input of circuits 100 and 200, but operate the NMOS and PMOS transistors at voltages below the sum of the transistor thresholds. This way, only one of the transistors in each NMOS-PMOS transistor pair can be activated at a time.

Each of the analog outputs of the DAC circuits 100, 200, 300 and 400 (Vx, Vout or VDIFF) may be used as a final output that is directly supplied to a load device. In some situations, it may be desirable to add an output buffer between the analog output and the load so that changes in the load on the output do not influence the DAC circuit. For example, coupling of load current or charge from the load into the DAC could potentially perturb the output value. Various types of buffers may be used. If the load is resistive, the output of the DAC circuit could be tied to a voltage buffer. If the load is capacitive, the DAC output could be tied to an operational transconductance amplifier (OTA).

In addition to an output buffer, it may be desirable to include a switch or a sample-and-hold unit to ensure that the DAC output does not gyrate through different values when proceeding from one conversion to the next. A sample-and-hold may be preferred where a smooth transition between conversion cycles is desired, as it would enable the results from the previous conversion cycle to be maintained until the results of the next conversion are ready for output.

The figures discussed herein are schematic in nature and may omit details and components not directly related to or necessary to explain the aspects of the DAC circuits discussed herein.

The above description is intended to be illustrative, and not restrictive. Those skilled in the art can appreciate from the foregoing description that the present invention may be implemented in a variety of forms, and that the various embodiments can be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings and specification.

The invention claimed is:

1. A digital-to-analog converter (DAC) circuit that forms an analog signal using charge sharing operations, the DAC circuit comprising:
    a plurality of digital components with associated parasitic capacitances, wherein the digital components include a parallel arrangement of FET inverters located between a charge redistribution node, providing a DAC analog output signal, and a first reference voltage node; and
    a main capacitor, located in parallel with the FET inverters between the charge redistribution node and the first reference voltage node, wherein the main capacitor is charged using a second reference voltage prior to the activation of the digital components, wherein the activation moves charge on the charge redistribution node from the main capacitor to the parasitic capacitances associated with the activated digital components;
    wherein the digital components are activated, based on a digital input code, such that charge is shared among the parasitic capacitances to form a first analog signal proportional to the digital input code.

2. The DAC circuit of claim 1, wherein the digital components are complementary metal oxide semiconductor (CMOS) inverters, and wherein the controller activates a PMOS transistor and an NMOS transistor in each inverter using separate gate inputs.

3. The DAC circuit of claim 1, wherein the digital components are complementary metal oxide semiconductor (CMOS) inverters, and wherein the controller activates a PMOS transistor and an NMOS transistor in each inverter using a shared gate input, and with an operating voltage below a sum of activation thresholds of the PMOS and NMOS transistors.

4. The DAC circuit of claim 1, wherein the main capacitor is formed using a parasitic capacitance associated with at least one additional digital component.

5. The DAC circuit of claim 1, wherein the digital components are activated based on a second code that is complementary to the digital input code, thereby transferring a portion of the charge on the main capacitor to selected ones of the digital components.

6. The DAC circuit of claim 5, wherein the reference voltage is disconnected from the main capacitor after the activation based on the second code and before the activation based on the digital input code.

7. The DAC circuit of claim 1, wherein:
    the controller activates the digital components based on a second code that is complementary to the digital input code, thereby forming a second analog signal; and
    the DAC circuit forms a voltage difference based on the first analog signal and the second analog signal.

8. The DAC circuit of claim 7, further comprising:
    a first amplifier that amplifies the first analog signal; and
    a second amplifier that amplifies the second analog signal, wherein the voltage difference is a difference between outputs of the first amplifier and the second amplifier.

9. The DAC circuit of claim 7, wherein the digital components one of:
    form the first analog signal and the second analog signal at different times, by processing the digital input code and the complementary code in sequence; and form the first analog signal and the second analog signal simultaneously, by processing the digital input code and the complementary code in parallel.

10. A method for performing digital-to-analog conversions using charge sharing operations, comprising:
charging a main capacitor located between a charge redistribution node and a first reference voltage node using a second reference voltage applied to the charge redistribution node; and
activating digital components in a digital-to-analog converter (DAC) circuit based on a digital input code, wherein the activation causes charge to be shifted from the main capacitor via the charge redistribution node onto parasitic capacitances associated with the digital components, thereby forming at the charge redistribution node a first analog signal that is proportional to the digital input code.

11. The method of claim 10, wherein the digital components are complementary metal oxide semiconductor (CMOS) inverters, and wherein the activation includes activating a PMOS transistor and an NMOS transistor in each inverter using separate gate inputs.

12. The method of claim 10, wherein the digital components are complementary metal oxide semiconductor (CMOS) inverters, and wherein the activation includes activating a PMOS transistor and an NMOS transistor in each inverter using a shared gate input, and with an operating voltage below a sum of activation thresholds of the PMOS and NMOS transistors.

13. The method of claim 10, wherein the main capacitor is formed using a parasitic capacitance associated with at least one additional digital component.

14. The method of claim 10, further comprising:
activating the digital components based on a second code that is complementary to the digital input code, thereby transferring a portion of the charge on the main capacitor to selected ones of the digital components.

15. The method of claim 14, further comprising:
disconnecting the reference voltage from the main capacitor after the activation based on the second code and before the activation based on the digital input code.

16. The method of claim 10, further comprising:
activating the digital components based on a second code that is complementary to the digital input code, thereby forming a second analog signal; and
forming a voltage difference based on the first analog signal and the second analog signal.

17. The method of claim 16, further comprising:
amplifying the first analog signal and the second analog signal; and
forming the voltage difference as a difference between the amplified first analog signal and the amplified second analog signal.

18. The method of claim 16, further comprising one of:
forming the first analog signal and the second analog signal at different times, by processing the digital input code and the complementary code in sequence; and
forming the first analog signal and the second analog signal simultaneously, by processing the digital input code and the complementary code in parallel.

* * * * *